United States Patent
Lee (10) Patent No.: US 7,215,588 B2
(45) Date of Patent: May 8, 2007

(54) APPARATUS FOR CONTROLLING SELF-REFRESH PERIOD IN MEMORY DEVICE

(75) Inventor: Jong Won Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 148 days.

(21) Appl. No.: 11/115,444

(22) Filed: Apr. 27, 2005

(65) Prior Publication Data

US 2005/0243629 A1 Nov. 3, 2005

(30) Foreign Application Priority Data

Apr. 28, 2004 (KR) .................. 10-2004-0029631

(51) Int. Cl.
*G11C 7/00* (2006.01)
(52) U.S. Cl. ...................... 365/222; 365/233
(58) Field of Classification Search ................ 365/222, 365/233

See application file for complete search history.

(56) References Cited

U.S. PATENT DOCUMENTS

| 5,488,587 A * | 1/1996 | Fukumoto .................. 365/222 |
| 6,246,619 B1 * | 6/2001 | Ematrudo et al. .......... 365/201 |
| 6,950,364 B2 * | 9/2005 | Kim ........................... 365/222 |

FOREIGN PATENT DOCUMENTS

KR 19950010624 2/1995

* cited by examiner

*Primary Examiner*—Hoai V. Ho
(74) *Attorney, Agent, or Firm*—Ladas & Parry LLP (57) ABSTRACT

Disclosed is an apparatus for controlling a self-refresh period in a memory device capable of normally performing a self-refresh operation that is indispensable to the operation of a volatile memory device using a refresh period control even if the inner temperature of the memory device is changed. The apparatus determines different bank refresh periods according to the self-refresh entering time in a self-refresh mode, and thus the refresh operation can properly be performed to cope with the change of inner temperature of the memory device.

11 Claims, 9 Drawing Sheets

APPARATUS FOR CONTROLLING SELF-REFRESH PERIOD IN MEMORY DEVICE

BACKGROUND OF THE INVENTION

1. Field of the invention

The present invention relates to an apparatus for controlling a self-refresh period in a memory device, and more particularly to an apparatus for controlling a self-refresh period in a memory device which can normally perform a self-refresh operation that is indispensable to the operation of a volatile memory device using a refresh period control even if the inner temperature of the memory is changed.

2. Description of the Prior Art

As is well known, a volatile memory device has the drawback in that it cannot maintain data stored in memory cells over a predetermined time due to leakage current components that the memory cells have.

In order to compensate for such limitations, a system for the memory device performs a refresh operation for restoring data at predetermined intervals. The refresh operation is classified into an auto-refresh operation that is performed during a normal operation of the memory device and a self-refresh operation that is performed in a state that the memory device performs the minimum operation in order to reduce the power consumption as the system does not operate for a long time. In a self-refresh mode, the refresh operation is performed in order to accurately maintain the stored data.

The refresh operation is basically the same as a raw-active operation and a precharge operation that are normal operations. That is, the data stored in the memory cells is amplified by a sense amplifier, and then the data is stored again in the memory cells.

Meanwhile, in the case of the self-refresh operation, the refresh operation should be performed at predetermined intervals without any command from an outside of the memory device, and thus the self-refresh operation is independently performed inside the memory chip.

That is, even if a row-active command is not applied from an outside, a row-active operation is performed, and then a precharge operation is performed.

Hereinafter, the self-refresh operation will be explained with reference to the accompanying drawings.

Figure 1:
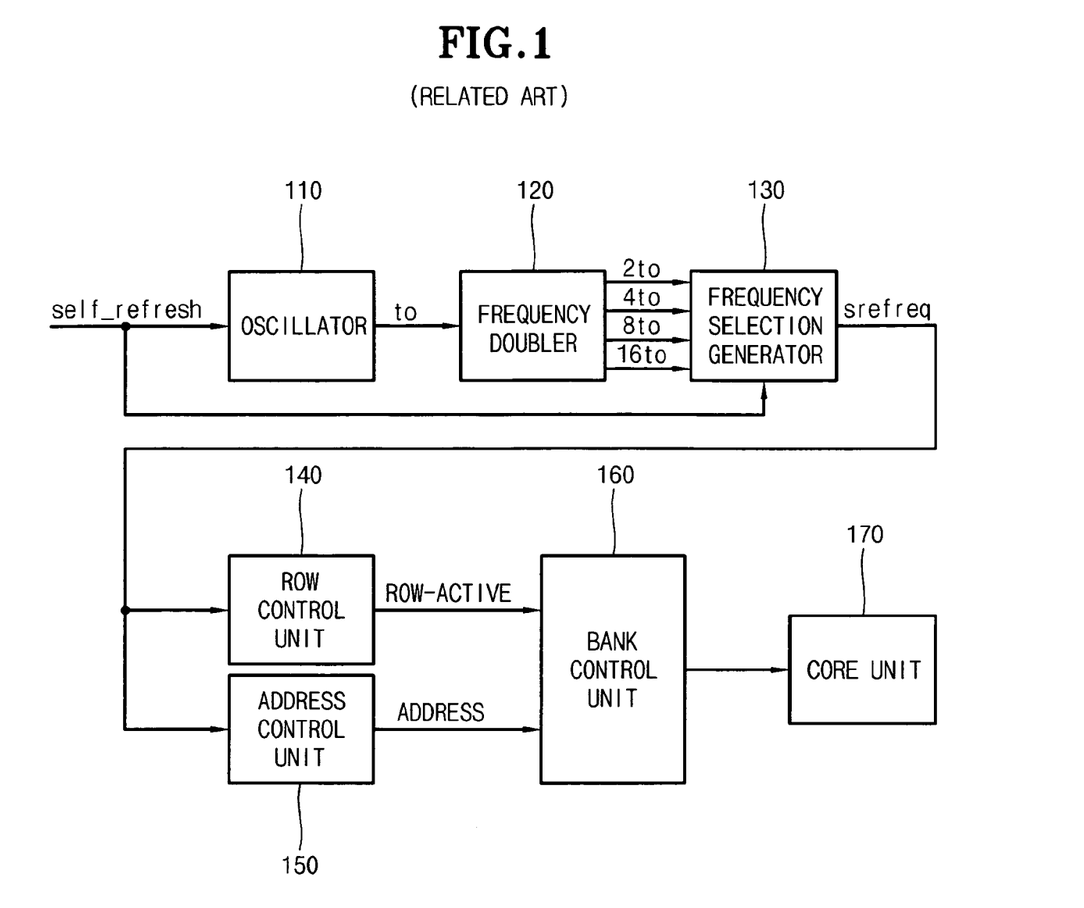
FIG. 1 is a view illustrating a conventional process of generating a refresh signal when a memory device enters into a self-refresh mode.

FIG. 1 is a view illustrating a conventional process of generating a refresh signal when a memory device enters into a self-refresh mode. FIG. 1 shows the process of internally generating a refresh signal srefreq that is a signal for operating the memory device in the same manner as the case that an active command is applied in the self-refresh mode.

As illustrated in FIG. 1, if a self-refresh command is input from the outside, a self-refresh command signal self_refresh obtained by combining signals produced from an internal command decoder (not illustrated) operates an oscillator 110 that operates for a period of $t_0$, and a frequency doubler 120 receives a signal having the period of $t_0$ from the oscillator 110, and generates pulse signals having predetermined periods of $2t_0$, $4t_0$, $8t_0$ and $16t_0$.

A frequency selection generator 130 is used to produce the refresh signal srefreq of FIG. 1, that is, the signal suitable to be used in the memory device by selecting a proper frequency signal among period signals having passed through the above-described process. A row control unit 140 receives this signal, and outputs a row-active signal for driving a corresponding word line by banks. Additionally, an address control unit 150 receives the signal, and outputs an address signal for operating word lines in an accurate operation order. For reference, a bank control unit 160 controls a plurality of banks included in a core unit 170.

Figure 2A:
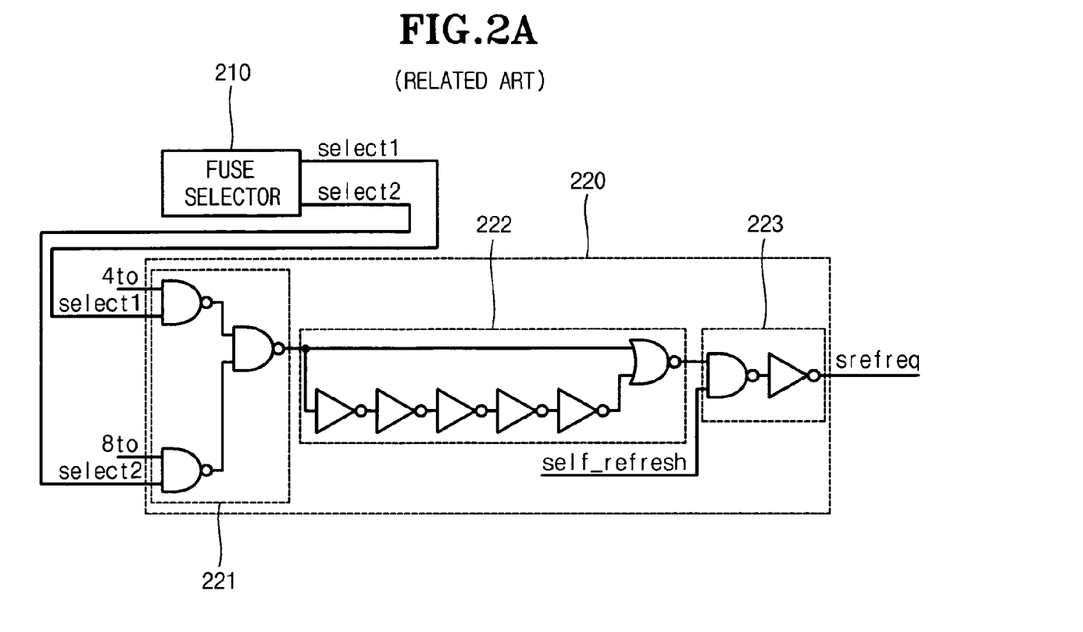
FIG. 2a is a circuit diagram of a frequency selection generator of FIG. 1.

FIG. 2a is a circuit diagram of a frequency selection generator 130 of FIG. 1. Referring to FIG. 2a, it is assumed that a pulse signal $4t_0$ having a period of $4t_0$ and a pulse signal $8t_0$ having a period of $8t_0$ are received from a frequency doubler 120.

As shown in FIG. 2a, the frequency selection generator is provided with a fuse selector 210 and a generation unit 220, and the generation unit 220 is provided with a selection unit 221, a pulse generation unit 222 and an output unit 223.

A pulse signal having a period suitable to be used in the memory device is selected between two pulse signals $4t_0$ and $8t_0$ generated from the frequency doubler 120 in accordance with frequency selection signals Select1 and Select2 generated from the fuse selector 210. One pulse signal selected as above is output as the refresh signal srefreq through the generation unit 220.

Figure 2B:
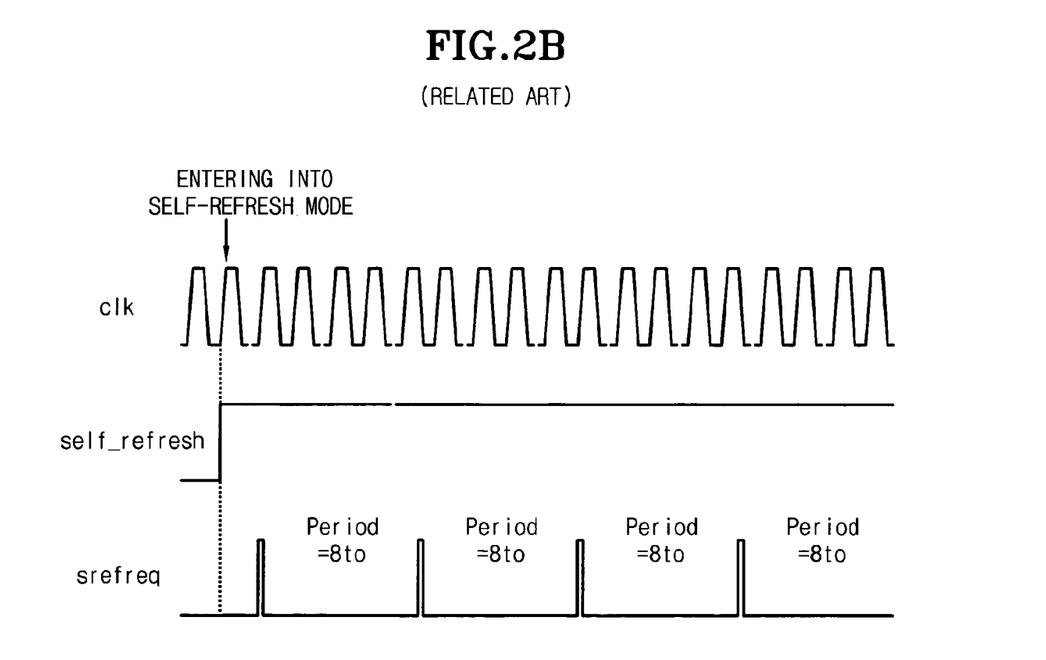

FIG. 2b is a waveform diagram explaining the operation of the frequency selection generator illustrated in FIG. 2a.

As illustrated in FIG. 2b, the frequency selection generator selects the pulse signal $8t_0$ having a period of $8t_0$ between the two pulse signals $4t_0$ and $8t_0$ received from the frequency doubler 120, and outputs the selected pulse signal as the refresh signal srefreshq. That is, if the self-refresh command signal self_refresh is changed to a high level when the memory device enters into the self-refresh mode, the refresh signal srefreq becomes a pulse signal having a period of $8t_0$.

As is already known, due to the structural limits of the volatile memory cells, the refresh operation is compulsory, and particularly, even if the memory device enters into the self-refresh mode, the refresh operation should be performed in the same manner.

In a normal operation of the memory device, heat is generated due to the high-speed operation of the memory device, and the inner temperature of the memory device is increased. If the memory device enters into the self-refresh mode in such a high-temperature state, the leakage current of the memory cell itself is increased, and the data is consumed as the leakage current to cause a data loss. In order to prevent such a data loss, the data should be restored by shortening the refresh period.

Meanwhile, as a predetermined time elapses, the inner temperature of the memory device is lowered, and thus the leakage current of the memory cell itself is reduced. In this case, the power consumption should be reduced by reducing the current through the lengthening of the refresh period.

However, according to the conventional apparatus for controlling a self-refresh period in a memory device as described above, the frequency selection generator (See FIG. 2) outputs the refresh signal srefreq having the period of one pulse signal selected through the output signals Select1 and Select2 of the fuse selector 210 when the memory device enters into the self-refresh mode. The refresh operation of the memory device is performed by the refresh signal srefreq at predetermined intervals. As a result, if the refresh period is lengthened in the event that the memory device is in a high-temperature state, a data loss may occur. Meanwhile, if the refresh period is excessively shortened in a state that the inner temperature of the memory device is lowered as the predetermined time elapses, it results in the excessive use of the current in the self-refresh mode to cause great power consumption.

SUMMARY OF THE INVENTION

Accordingly, the present invention has been made to solve the above-mentioned problems occurring in the prior art, and provides an apparatus for controlling a self-refresh period in a memory device that can control the period of a refresh signal srefreq by selecting pulse signals having different periods with the lapse of time in a self-refresh mode using a double refresh frequency generator as a device for controlling the period of the refresh signal periodically made in the self-refresh mode.

That is, the present invention provides a self-refresh control apparatus in a memory device that can perform a self-refresh operation to properly cope with the change of the inner temperature of the memory device when the memory device that is in a high-temperature state enters into a self-refresh mode.

In one embodiment of the present invention, there is provided an apparatus for controlling a self-refresh period in a memory device, which comprises a clock generation means for generating a plurality of clock signals having different frequencies in response to a self-refresh command, a selection means for selecting one of the plurality of clock signals output from the clock generation means, an inner address generation means for generating an inner address required for a self-refresh operation of the memory device in response to an output signal of the selection means, and a period signal generation means for receiving a most significant bit of the inner address and outputting a period signal corresponding to a multiple of a generation period of the most significant bit, wherein the selection means selects one of the plurality of clock signals in response to the output signal of the period signal generation means.

In the embodiment of the present invention, the frequency of the clock signal selected by the selection means before being controlled by the period signal generation means is higher than the frequency of the clock signal selected by the selection means after being controlled by the period signal generation means. Here, the frequency of the clock signal selected by the selection means before being controlled by the period signal generation means is generated just after the self-refresh command is applied, and the frequency of the clock signal selected by the selection means after being controlled by the period signal generation means is generated after a predetermined time elapses from a time point that the self-refresh command is applied. Meanwhile, whether the predetermined time elapses from the time point that the self-refresh command is applied is determined by the output signal of the period signal generation means.

In another embodiment of the present invention, there is provided an apparatus for controlling a self-refresh period in a memory device, which comprises an oscillator for generating a first pulse signal having a first period by a self-refresh command signal, a frequency doubler for receiving the first pulse signal output from the oscillator and generating a plurality of second pulse signals having increased periods in comparison to the period of the first pulse signal, a frequency selection generator for selecting and outputting one of the plurality of second pulse signals output from the frequency doubler, an address control means for receiving the output signal of the frequency selection generator and outputting an address signal, and a double refresh frequency generator for receiving a most significant bit signal of the address signal output from the address control means and outputting a third pulse signal to the frequency selection generator, wherein the self-refresh command signal is applied to the frequency selection generator and the double refresh frequency generator, and the frequency selection generator that has received the third pulse signal selects the pulse signals having different periods from the plurality of second pulse signals and outputs the selected pulse signals with a lapse of time.

BRIEF DESCRIPTION OF THE DRAWINGS

The above and other objects, features and advantages of the present invention will be more apparent from the following detailed description taken in conjunction with the accompanying drawings, in which:

FIG. 2b is a waveform diagram explaining the operation of the frequency selection generator illustrated in FIG. 2a;

FIG. 4b is a circuit diagram of a control unit of FIG. 4a;

FIG. 4c is a circuit diagram of a generation unit of FIG. 4a;

FIG. 4d is a waveform diagram explaining the operation of the frequency selection generator of FIG. 4a;

FIG. 6b is a block diagram of a generation unit of FIG. 6a;

FIG. 6d is a circuit diagram of a selection unit of FIG. 6a.

DETAILED DESCRIPTION OF THE PREFERRED EMBODIMENTS

Hereinafter, preferred embodiments of the present invention will be described with reference to the accompanying drawings. In the following description and drawings, the same reference numerals are used to designate the same or similar components, and so repetition of the description on the same or similar components will be omitted.

Figure 3:
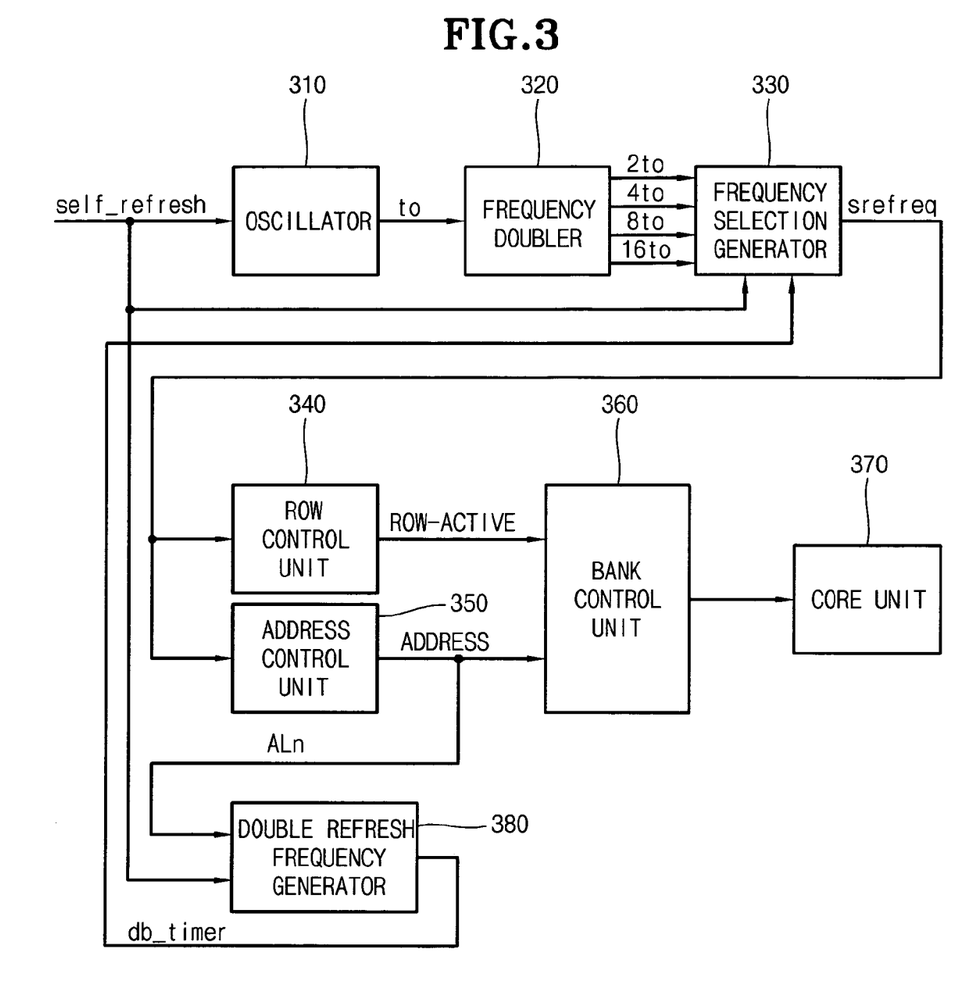
FIG. 3 is a view illustrating a process of generating a refresh signal when a memory device enters into a self-refresh mode according to the present invention.

FIG. 3 is a view illustrating a process of generating a refresh signal when a memory device enters into a self-refresh mode according to the present invention.

As illustrated in FIG. 3, the circuit of FIG. 3 is provided with a frequency selection generator 330 and a double refresh frequency generator 380 in addition to an oscillator 310, a frequency doubler 320, a row control unit 340, an address control unit 350, a bank control unit 360 and a core unit 370 that are the same constituent elements as the conventional circuit illustrated in FIG. 1. The detailed explanation of the oscillator 310, the frequency doubler 320, the row control unit 340, the bank control unit 360 and the core unit 370 will be omitted.

The frequency selection generator 330 receives four pulse signals $2t_0$, $4t_0$, $8t_0$ and $16t_0$ that have periods of $2t_0$, $4t_0$, $8t_0$ and $16t_0$, respectively, and that have passed through the frequency doubler 320, a self-refresh command signal self_refresh and an output signal db_timer of the double refresh frequency generator 380. Additionally, the frequency selection generator 330 selects one of the four received pulse signals $2t_0$, $4t_0$, $8t_0$ and $16t_0$, and outputs a refresh signal srefreq having the period of the selected pulse signal.

The row control unit 340 receives the refresh signal srefreq and outputs a row-active signal for driving a corresponding word line by banks. The address control unit 350 receives the refresh signal and outputs an address signal for operating word lines in an accurate operation order. For reference, the bank control unit 360 controls a plurality of banks included in the core unit 370.

The double refresh frequency generator 380, which receives the MSB (Most Significant Bit) signal ALn that is the N-th bit address signal of the address signal output from the address control unit 350, increases the period of the received signal by double, four times, 8 times, 16 times, . . . , $2^n$ times (where, n is an integer), respectively, selects and transfers one of the N pulse signals 2tref, 4tref, 8tref, 16tref, . . . , $2^n$tref having the increased periods to the frequency selection generator 330.

Hereinafter, the circuit of FIG. 3 will be explained in detail with reference to the accompanying drawings.

FIGS. 4a to 4d illustrate the construction and the operation waveforms of the frequency selection generator 330. Referring to FIGS. 4a to 4d, it is exemplified that the pulse signal $4t_0$ having the period of $4t_0$ and the pulse signal $8t_0$ having the period of $8t_0$ among the pulse signals $2t_0$, $4t_0$, $8t_0$ and $16t_0$ having the periods of $2t_0$, $4t_0$, $8t_0$ and $16t_0$ received from the frequency doubler 320 are received.

Figure 4A:
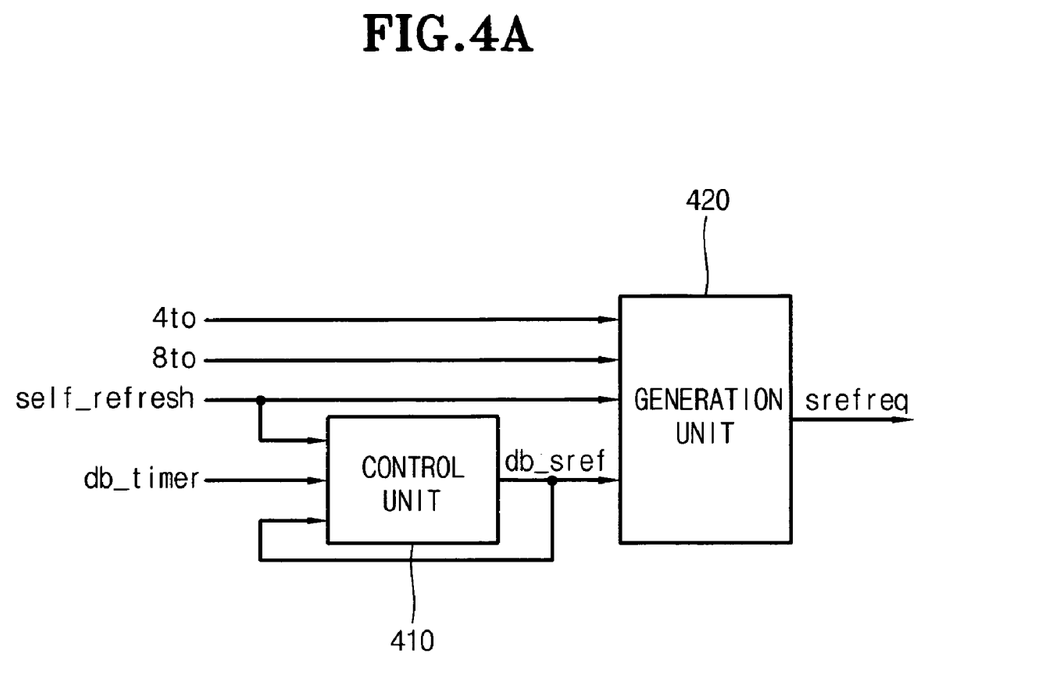
FIG. 4a is a block diagram of a frequency selection generator of FIG. 3.

FIG. 4a is a block diagram of the frequency selection generator 330 of FIG. 3.

As illustrated in FIG. 4a, the frequency selection generator is provided with a control unit 410 and a generation unit 420.

The control unit 410 receives a self-refresh command signal self_refresh, a control signal db_sref and an output signal db_timer of the frequency doubler 320, and outputs the control signal db_sref to the generation unit 420 and the control unit 410.

The generation unit 420 receives the control signal db_sref, the self-refresh command signal self_refresh and two pulse signals $4_0$ and $8t_0$ from the frequency doubler 320. The generation unit 420 selects one of the two pulse signals $4t_0$ and $8t_0$ and outputs the refresh signal srefreq having the period of the selected pulse signal to the row control unit 340 and the address control unit 350.

Figure 4B:
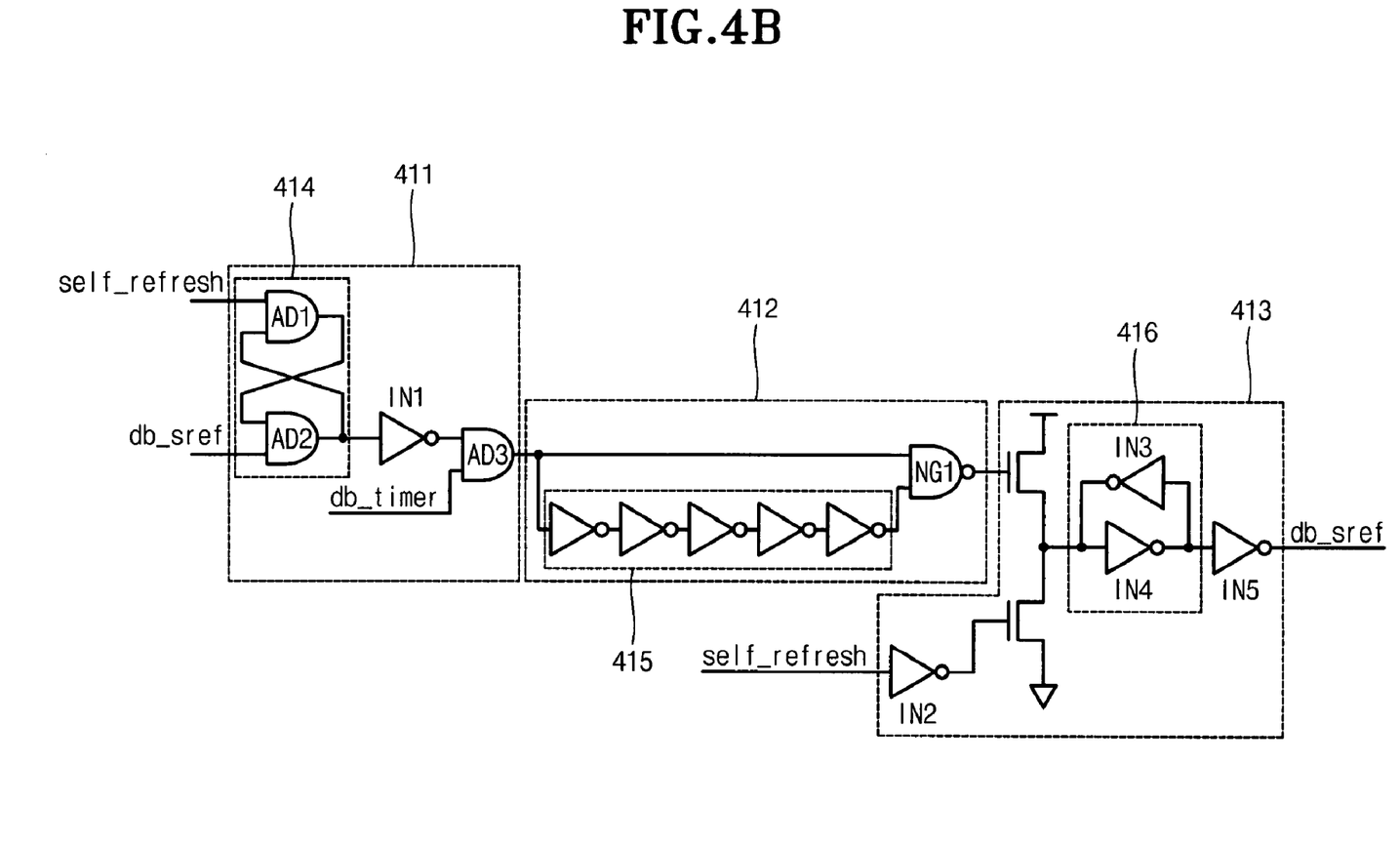

FIG. 4b is a circuit diagram of the control unit 410 of FIG. 4a.

As illustrated in FIG. 4b, the control unit is provided with an input unit 411, a pulse generation unit 412 and an output unit 413.

The input unit 411 receives the self-refresh command signal self_refresh, the control signal db_sref and the output signal db_timer of the double refresh frequency generator 380, and transfers its output signal to the pulse generation unit 412. The pulse generation unit 412 transfers the received signal to the output unit 413, and the output unit 413 receives the output signal of the pulse generation unit 412 and the self-refresh command signals self_refresh, and transfers the control signal db_sref to the generation unit 420 and the input unit 411.

The input unit 411 is provided with a latch unit 414 including two AND gates AD1 and AD2, an inverter IN1 and an AND gate AD3. The two AND gates AD1 and AD2 of the latch unit 414 receives the self-refresh command signal sref_refresh and the control signal db_sref. The inverter IN1 receives and inverts an output signal of the latch unit 414, and the AND gate AD3 receives an output signal of the inverter IN1 and the output signal db_timer of the double refresh frequency generator 380, and transfers its output signal to the pulse generation unit 412.

The pulse generation unit 412 is provided with an inverter chain 415 and a NAND gate NG1. The pulse generation unit 412 receives and transfers the output signal of the input unit 411 to the output unit 413.

The output unit 413 is provided with two NMOS transistors N1 and N2, two inverters IN2 and IN5, and a latch unit 416 including two inverters IN3 and IN4. The NMOS transistor N1 receives and transfers the output signal of the pulse generation unit 412 to the latch unit 416. The inverter IN2 receives the self-refresh command signal sref_refresh, and transfers its output signal to the NMOS transistor N2. The NMOS transistor N2 that has received the output signal of the inverter IN2 transfers its output signal to the latch unit 416, and an output signal of the latch unit 416 is output through an inverter IN5 as the control signal db_sref that is the output signal of the control unit 410.

Hereinafter, the operation of the control unit (See FIG. 4b) in the case in which the memory device enters into the self-refresh mode and in the case in which the memory device does not enter into the self-refresh mode will be explained.

In the case in which the memory device does not enter into the self-refresh mode, the self-refresh command signal self_refresh becomes low. The inverter IN2 receives the low-level self-refresh command signal self_refresh and applies its high-level output signal to the NMOS transistor N2. The NMOS transistor N2 is turned on and applies its low-level output signal to the latch unit 416 to make the output signal db_sref of the control unit 410 low.

Meanwhile, in the case in which the memory device enters into the self-refresh mode, the self-refresh command signal self_refresh becomes high, and the NMOS transistor N2 is turned off. At the first rising edge of the output pulse signal db_timer of the double refresh frequency generator 380, the NMOS transistor N1 is turned on, and the control signal db_sref becomes high. That is, before the first rising edge of the output signal db_timer of the double refresh frequency generator 380 after the memory device enters into the self-refresh mode, the control signal db_sref is at a low level by the latch unit 416.

Figure 4C:
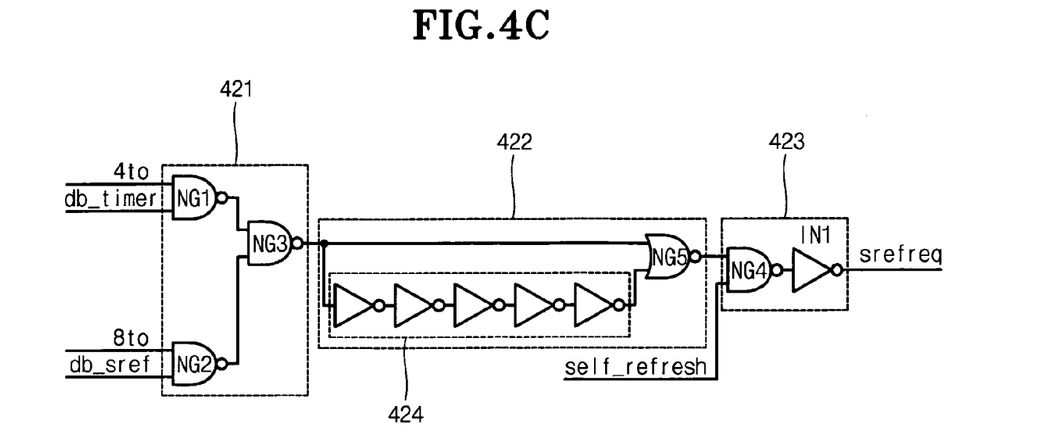

FIG. 4c is a circuit diagram of the generation unit of FIG. 4a.

As illustrated in FIG. 4c, the generation unit 420 is provided with a selection unit 421, a pulse generation unit 422 and an output unit 423.

The selection unit 421 selects one pulse signal between the two pulse signals $4t_0$ and $8t_0$ received from the frequency doubler 320 according to the control signal db_sref, and transfers the selected pulse signal to the pulse generation unit 422.

The pulse generation unit 422 transfers the received pulse signal to the output unit 423, and the output unit 423 output the pulse signal received from the pulse generation unit 422 as the refresh signal srefreq according to the self-refresh command signal self_refresh.

The selection unit 421 is provided with three NAND gates NG1, NG2 and NG3. The NAND gate NG1 receives the inverted control signal db_srefb and the pulse signal $4t_0$ having the period of $4t_0$. Meanwhile, the NAND gate NG2 receives the control signal db_sref and the pulse signal $8t_0$ having the period of $8t_0$. If the control signal db_sref is at a low level, the selection unit 421 transfers the pulse signal $4t_0$ having the period of $4t_0$ to the pulse generation unit 422, while if the control signal db_sref is at a high level, it transfers the pulse signal $8t_0$ having the period of $8t_0$ to the pulse generation unit 422.

The pulse generation unit 424 that has received the pulse signal from the selection unit 421 is provided with an inverter chain 424 and a NOR gate NG5, and transfers the received pulse signal to the output unit 423.

The output unit 423 is provided with a NAND gate NG4 and an inverter IN1. If the self-refresh command signal self_refresh is at a low level, the output unit 423 outputs the low-level refresh signal srefreq, while if the self-refresh command signal self_refresh is at a high level, it outputs the pulse signal received from the pulse generation unit 422 as the refresh signal srefreq.

Figure 4D:
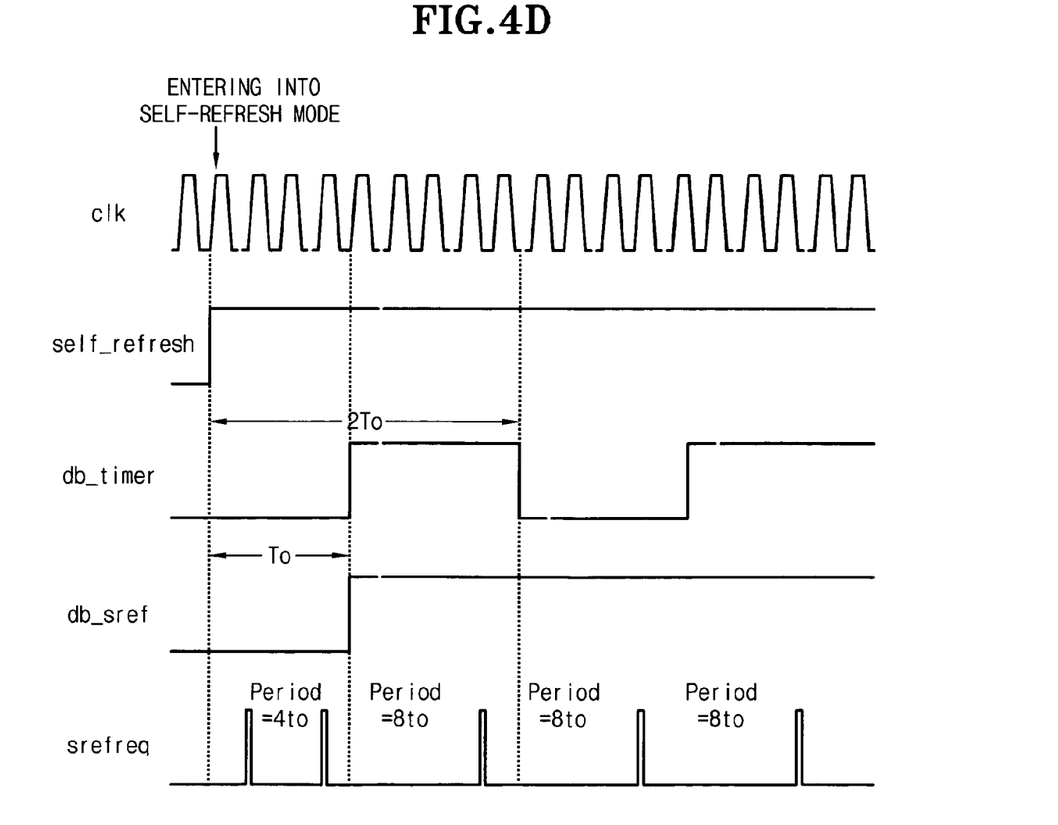

FIG. 4*d* is a waveform diagram explaining the operation of the frequency selection generator 330 of FIG. 4*a*.

As illustrated in FIG. 4*d*, if a clock clk is applied to the memory device and the memory device enters into the self-refresh mode, the self-refresh command signal self_refresh becomes high. The double refresh frequency generator 380 receives the high-level self-refresh command signal self_refresh and output the pulse signal db_timer having a period of $2T_0$. The pulse signal db_timer having the period of $2T_0$ is applied to the control signal 410, and at the first rising edge of the pulse signal db_sref, that is, when the time of $T_0$ elapses after the memory device enters into the self-refresh mode, the control signal db_sref becomes high. Consequently, for a time period in which the control signal db_sref is at a low level (i.e., for the time period $T_0$ after the memory device enters into the self-refresh mode), the generation unit 420 selects the pulse signal having the period of $4t_0$, and outputs the refresh signal srefreq for the period of $4t_0$. Meanwhile, for a time period in which the control signal db_sref is at a high level (i.e., after the time period $T_0$), the generation unit 420 selects the pulse signal having the period of $8t_0$, and outputs the refresh signal srefreq for the period of $8t_0$.

Figure 5:
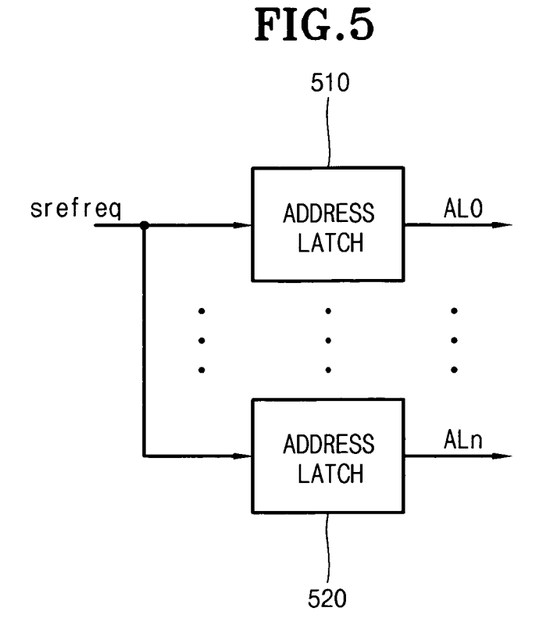
FIG. 5 is a block diagram of an address control unit of FIG. 3.

FIG. 5 is a block diagram of the address control unit 350 of FIG. 3.

As illustrated in FIG. 5, the address control unit 350 is provided with a plurality of address latches 510 and 520.

The address latches 510 and 520 receive the refresh signal srefreq from the frequency selection generator 330, and output N-bit address signals $AL_0$ and $AL_n$. The address signals $AL_0$ and $AL_n$ are transferred to the bank control unit 360. Additionally, the MSB signal $AL_n$ that is the N-th bit signal of the address signals $AL_0$ and $AL_n$ is transferred to the double refresh frequency generator 380.

Figure 6A:
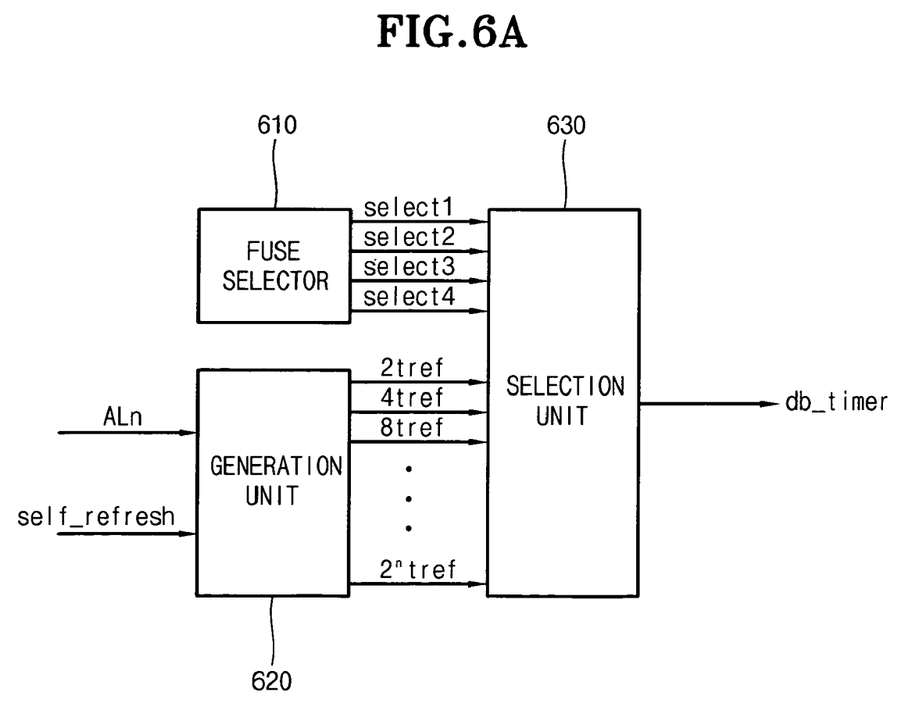
FIG. 6a is a block diagram of a double refresh frequency generator of FIG. 3.

FIG. 6*a* is a block diagram of the double refresh frequency generator 380 of FIG. 3.

As illustrated in FIG. 6*a*, the double refresh frequency generator 380 is provided with a fuse selector 610, a generation unit 620 and a selection unit 660.

The fuse selector 610 outputs four frequency selection signals Select1, Select2, Select3 and Select4 to the selection unit 660. The generation unit 620 receives the self-refresh command signal self_refresh and the MSB signal $AL_n$ from the address control unit 350, and transfers N pulse signals 2tref, 4tref, 8tref, 16tref, . . . , $2^n$tref to the selection unit 660.

The selection unit 660 selects one of the N pulse signals 2tref, 4tref, 8tref, 16tref, . . . , $2^n$tref according to the frequency selection signals Select1, Select2, Select3 and Select4, and transfers the selected pulse signal to the frequency selection generator 330.

Figure 6B:
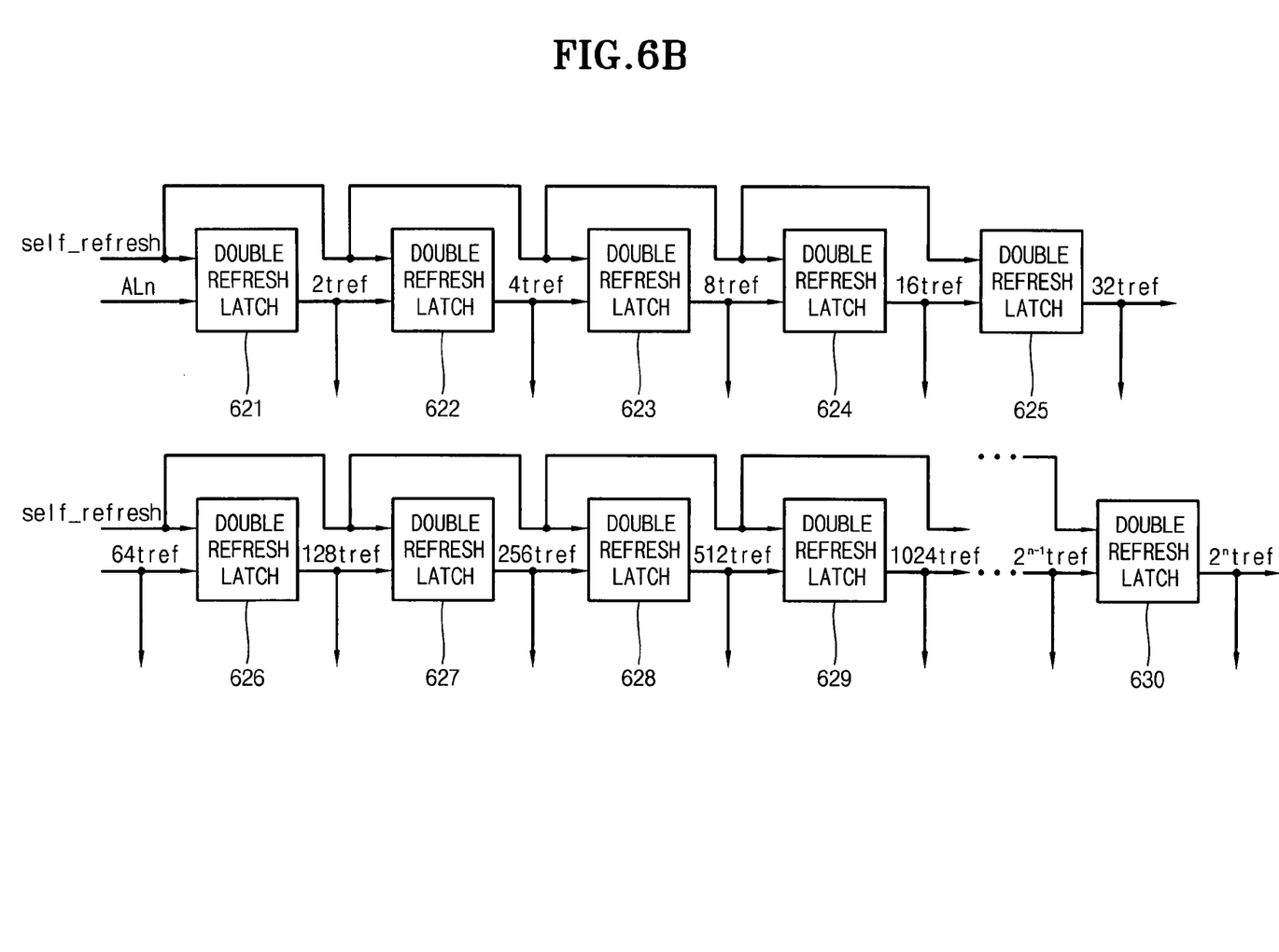

FIG. 6*b* is a block diagram of the generation unit 620 of FIG. 6*a*.

As illustrated in FIG. 6*b*, the generation unit 620 is provided with N double refresh latches 621 to 630.

The respective double refresh latches 621 to 630 are connected in the form of a chain, and receive the self-refresh command signal self_refresh. The MSB signal $AL_n$ transferred from the address control unit 350 is transferred to the double refresh latch 621. The double refresh latch 621 that has received the MSB signal $AL_n$ generates and transfers a pulse signal 2tref having a period that is double the period of the MSB signal $AL_n$ to the double refresh latch 622 and the selection unit 660 connected to its output terminal. The double refresh latch 622 that has received the pulse signal 2tref having the period that is double the period of the MSB signal $AL_n$ doubles again the period of the received pulse signal, and transfers a pulse signal 4tref having a period that is four times the period of the MSB signal $AL_n$ to the double refresh latch 623 and the selection unit 660 connected to its output terminal. The double refresh latch 623 that has received the pulse signal 4*tref* having the period that is four times the period of the MSB signal $AL_n$ doubles again the period of the received pulse signal, and transfers a pulse signal 8tref having a period that is eight times the period of the MSB signal $AL_n$ to the double refresh latch 624 and the selection unit 660 connected to its output terminal.

As described above, the N double refresh latches 621 to 630 increase the period of the MSB signal $AL_n$ by double, four times, 8 times, 16 times, . . . , $2^n$ times, respectively, and output the pulse signals 2tref, 4tref, 8tref, 16tref, . . . , $2^n$tref to the double refresh latch and the selection unit 660, respectively.

Figure 6C:
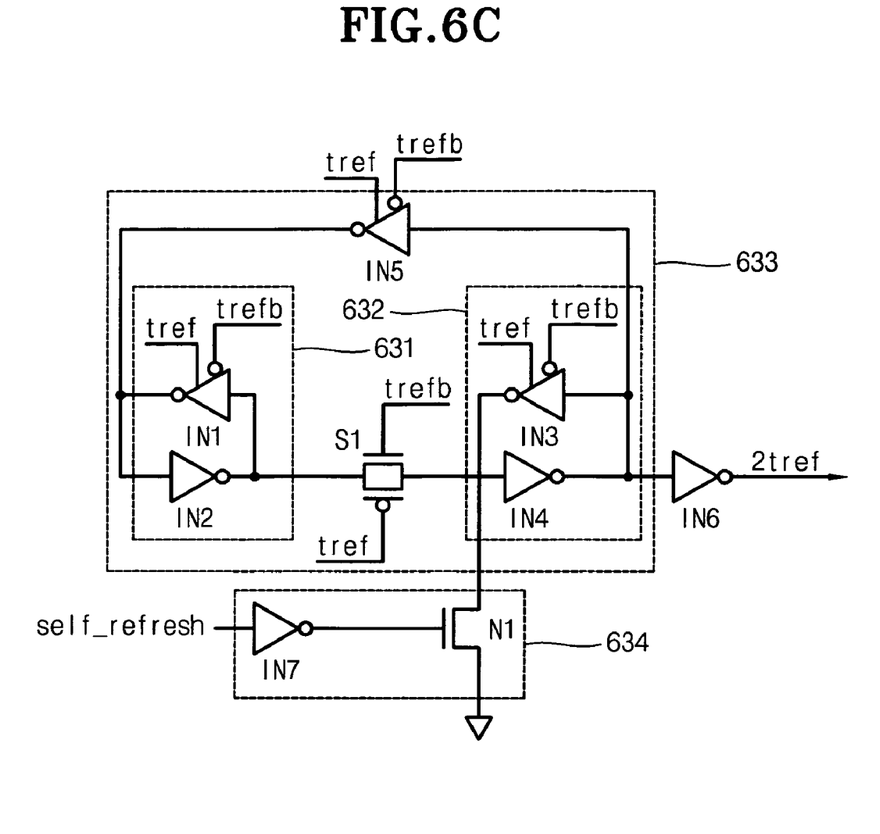
FIG. 6c is a circuit diagram of a latch unit of FIG. 6b.

FIG. 6*c* is a circuit diagram of one of the same N double refresh latches 621 to 630 illustrated in FIG. 6*b*.

As illustrated in FIG. 6*c*, the double refresh latch is provided with two latch units 631 and 632, a switch S1, a switch unit 634, and two inverters IN5 and IN6.

The two latches 631 and 632 are composed of two inverters IN1 and IN2, and IN3 and IN4, and the switch S1 selectively connects the two latch units 631 and 632. The inverter IN5 forms another latch unit 633 for holding and transferring an output signal of the latch unit 632 to the other latch unit 631. The inverter IN6 receives the output signal of the latch unit 632, and outputs the output signal of the double refresh latch. The switch unit 634 is provided with an inverter IN7 and an NMOS transistor N1.

The inverters IN1, IN3 and IN5 and the switch S1 are turned on/off by the two pulse signals tref and trefb. The pulse signal tref corresponds to the pulse signals $AL_n$, 2tref, 4tref, 8tref, 16tref, 32tref, . . . , $2^{n-1}$tref received by the N double refresh latches 621 to 630, respectively. The pulse signal trefb is an inverted signal of the pulse signal tref. The switch unit 634 is turned on/off by the self-refresh command signal self_refresh.

Hereinafter, the operation of the double refresh latch in the case in which the memory device is not in the self-refresh mode and in the case in which the memory device is in the self-refresh mode will be explained in detail.

In the case in which the memory device is not in the self-refresh mode, the self-refresh command signal self_refresh becomes low, and the switch unit 634 is turned on. Thus, the double refresh latch outputs a low-level signal that is not the pulse signal.

Meanwhile, in the case in which the memory device is in the self-refresh mode, the self-refresh command signal self_refresh becomes high, and the switch unit 634 is turned off. In this case, the inverters IN1, IN3 and IN5 and the switch S1 are repeatedly turned on/off by the pulse signals tref and trefb input thereto. If the pulse signal tref is at the high level, the inverts IN3 and IN5 are turned on, and the invert IN1 and the switch S1 are turned off. The inverters IN3 and IN5 hold the output signal of the latch unit 632. If the pulse signal tref is at the low level, the inverter IN1 and the switch S1 are turned on and the inverters IN3 and IN5 are turned off. Accordingly, the inverter IN1 holds the output signal of the latch unit 631, and the switch S1 transfers the output signal of the latch unit 631 to the inverter IN4.

The double refresh latch repeats the above-described process by the pulse signal tref, and thus the double refresh latch outputs the pulse signal 2tref having the period that is double the period of the received pulse signal tref.

Figure 6D:
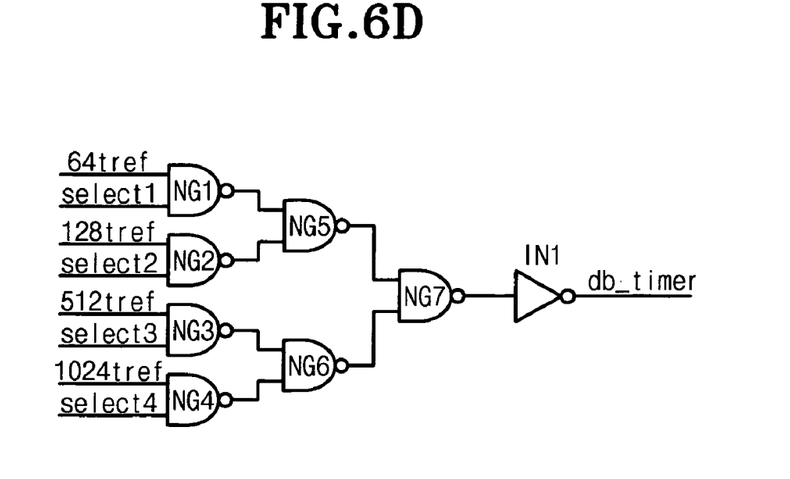

FIG. 6d is a circuit diagram of the selection unit 660 of FIG. 6a.

Referring to FIG. 6d, it is exemplified that pulse signals 64tref, 128tref, 512tref and 1024tref having periods that are 64 times, 128 times, 512 times and 1024 times the period of the MSB signal $AL_n$, respectively, are selected among the N pulse signals received from the generation unit 620 according to the four frequency selection signals Select1, Select2, Select3 and Select4.

As illustrated in FIG. 6d, the selection unit is provided with 7 NAND gates NG1 to NG7 and an inverter IN1.

The four pulse signals 64tref, 128tref, 512tref and 1024tref and the four frequency selection signals Select1, Select2, Select3 and Select4 are transferred to the four NAND gates NG1, NG2, NG3 and NG4. If one of the four pulse signals 64tref, 128tref, 512tref and 1024tref is selected and the frequency selection signal corresponding to the selected pulse signal is in a high level, the selection unit 660 selects and outputs one pulse signal corresponding to the high-level frequency selection signal. The selected pulse signal is transferred to the frequency selection generator 330.

For example, if the pulse signal 512tref is selected, and only the frequency selection signal Select3 among the four frequency selection signals Select1, Select2, Select3 and Select4 is in a high level while the other signals Select1, Select2 and Select4 are in a low level, the selection unit 660 output the pulse signal 512tref.

Hereinafter, the difference between the apparatus according to the present invention and the conventional apparatus and the excellency of the present invention will be explained.

In explanation, it is assumed that the refresh signal srefreq having the period of $8t_0$ is output when the inner temperature of the memory device is lowered below a predetermined degree as a sufficient time elapses after the memory device enters into the self-refresh mode.

According to the conventional apparatus, if the memory device enters into the self-refresh mode, as illustrated in FIG. 2a, the frequency selection generator selects one of the pulse signals $4t_0$ and $8t_0$ having the periods of $4t_0$ and $8t_0$, respectively, transferred from the frequency doubler according to the frequency selection signals Select1 and Select output from the fuse selector 210, and outputs the refresh signal srefreq having the period of the selected pulse signal. That is, the frequency selection generator selects the pulse signal $8t_0$ having the period of $8t_0$ according to the frequency selection signal Select2. Accordingly, the frequency selection generator, as illustrated in FIG. 2b, outputs the refresh signal srefreq having the period of $8t_0$.

By contrast, according to the apparatus according to the present invention, if the memory device enters into the self-refresh mode, as illustrated in FIG. 6a, the double refresh frequency generator selects the pulse signal 8tref having the periods of $8t_0$ among the N pulse signals 2tref, 4tref, 8tref, . . . , $2^n$tref output from the generation unit 620 according to the frequency selection signals Select1, Select2, Select3 and Select4 output from the fuse selector 610, and transfers the selected pulse signal to the frequency selection generator 330. The frequency selection generator that has received the pulse signal 8tref, as illustrated in FIGS. 4a to 4c, selects the pulse signal $4t_0$ having the period of $4t_0$ between the pulse signals $4t_0$ and $8t_0$ having the periods of $4t_0$ and $8t_0$, respectively, transferred from the frequency doubler according to the control signal db_sref for a predetermined time period, and then selects the pulse signal $8t_0$ having the period of $8t_0$ according to the control signal db_sref after the predetermined time period. That is, as illustrated in FIG. 4d, the frequency selection generator outputs the refresh signal srefreq having the period of $4t_0$ for the predetermined time period $T_0$ and then outputs the refresh signal srefreq having the period of $8t_0$ after the predetermined time period $T_0$ according to the control signal db_sref.

As described above, according to the apparatus for controlling a self-refresh period in a memory device according to the present invention, the bank refresh periods are differently set according to the self-refresh entering time in a self-refresh mode, and thus the refresh operation can properly be performed to cope with the change of the inner temperature of the memory device.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. An apparatus for controlling a self-refresh period in a memory device, comprising:
   a clock generation means for generating a plurality of clock signals having different frequencies in response to a self-refresh command;
   a selection means for selecting one of the plurality of clock signals output from the clock generation means;
   an inner address generation means for generating an inner address required for a self-refresh operation of the memory device in response to an output signal of the selection means; and
   a period signal generation means for receiving a most significant bit of the inner address and outputting a period signal corresponding to a multiple of a generation period of the most significant bit;
   wherein the selection means selects one of the plurality of clock signals in response to the output signal of the period signal generation means.

2. The apparatus as claimed in claim 1, wherein the frequency of the clock signal selected by the selection means before being controlled by the period signal generation means is higher than the frequency of the clock signal selected by the selection means after being controlled by the period signal generation means.

3. The apparatus as claimed in claim 2, wherein the frequency of the clock signal selected by the selection means before being controlled by the period signal generation means is generated just after the self-refresh command is applied; and
   the frequency of the clock signal selected by the selection means after being controlled by the period signal generation means is generated after a predetermined time elapses from a time point that the self-refresh command is applied.

4. The apparatus as claimed in claim 3, wherein whether the predetermined time elapses from the time point that the self-refresh command is applied is determined by the output signal of the period signal generation means.

5. An apparatus for controlling a self-refresh period in a memory device, comprising:
- an oscillator for generating a first pulse signal having a first period by a self-refresh command signal;
- a frequency doubler for receiving the first pulse signal output from the oscillator and generating a plurality of second pulse signals having increased periods in comparison to the period of the first pulse signal;
- a frequency selection generator for selecting and outputting one of the plurality of second pulse signals output from the frequency doubler;
- an address control means for receiving the output signal of the frequency selection generator and outputting an address signal; and
- a double refresh frequency generator for receiving a most significant bit (MSB) signal of the address signal output from the address control means and outputting a third pulse signal to the frequency selection generator;
- wherein the self-refresh command signal is applied to the frequency selection generator and the double refresh frequency generator, and the frequency selection generator that has received the third pulse signal selects the pulse signals having different periods from the plurality of second pulse signals and outputs the selected pulse signals with a lapse of time.

6. The apparatus as claimed in claim 4, wherein the double refresh frequency generator comprises:
- a fuse selector for outputting a plurality of frequency selection signals according to a fuse connection;
- a second generation unit for receiving the MSB signal from the address control means and outputting N fourth pulse signals; and
- a second selection means for selecting one of the N fourth pulse signals and outputting the third pulse signal;
- wherein the self-refresh command signal is applied to the second generation means;
- the second generation means increases the period of the received MSB signal by double, four times, 8 times, . . . , $2^n$ times (where, n is an integer), respectively, and outputs the N fourth pulse signals; and
- the second selection means selects one of the N fourth pulse signals according to the plurality of frequency selection signals and outputs the third pulse signal.

7. The apparatus as claimed in claim 6, wherein the second generation means is provided with N first latch means;
- the N first latch means are connected in the form of a chain;
- the self-refresh command signal is applied to the N first latch means;
- the MSB signal is applied to the first latch means among the N first latch means;
- an output signal of the i-th (where, 'i' is an integer in the range of 1 to N) first latch means is applied to the (i+1)-th first latch means and the second selection means; and
- the N first latch means increases the period of the received signal by double and outputs the N fourth pulse signals.

8. The apparatus as claimed in claim 7, wherein the i-th first latch means comprises:
- a second latch means composed of a first inverter and a second inverter;
- a third latch means composed of a third inverter and a fourth inverter;
- a switch connected between an output terminal of the second latch means and an input terminal of the third latch means;
- a fifth inverter for receiving and transferring an output signal of the third latch means to the second latch means;
- a switch means connected between the input terminal of the third latch means and ground; and
- a sixth inverter for receiving the output signal of the third latch means and outputting the output signal of the i-th first latch means;
- wherein the self-refresh command signal is applied to the switch means;
- the pulse signal received by the i-th first latch means is applied to the first, third and fifth inverters and the switch;
- the first, third and fifth inverter and the switch are turned on/off by the received pulse signal;
- the operation of the second to fourth latch means is enabled by the turn-on/off of the first, third and fifth inverters and the switch; and
- the i-th first latch means doubles the period of the received pulse signal by the operation of the second to fourth latch means to output the pulse signal having the double period.

9. The apparatus as claimed in claim 4, wherein the frequency selection generator comprises:
- a control means for receiving the third pulse signal and outputting a first control signal; and
- a first generation means for selecting and outputting one of the plurality of second pulse signals according to the first control signal;
- wherein the self-refresh command signal is applied to the control means and the first generation means;
- the control means outputs the first control signal that is changed from a low level to a high level if the third pulse signal is enabled to a high level; and
- the first generation means selects and outputs the pulse signals having the different periods among the plurality of second pulse signals according to a level of the first control signal.

10. The apparatus as claimed in claim 9, wherein the control means comprises:
- an input means for receiving the third pulse signal and the first control signal;
- a first pulse generation means for receiving an output signal of the input means; and
- a first output means for receiving an output signal of the first pulse generation means and transferring the first control signal to the first generation means and the input means;
- wherein the self-refresh command signal is applied to the input means and the first output means; and
- the first control signal is shifted from a low level to a high level at a first rising of the third pulse signal.

11. The apparatus as claimed in claim 9, wherein the first generation means comprises:
- a first selection means for selecting and outputting one of the plurality of second pulse signals according to the first control signal;
- a second pulse generation means for receiving an output signal of the selection means; and a second output means for receiving an output signal of the second pulse generation means and outputting a refresh signal;

wherein the self-refresh command signal is applied to the second output means;

the first selection means selects and outputs the pulse signals having the different periods among the plurality of second pulse signals according to the level of the first control signal; and the second output means outputs the refresh signal having the period of the pulse signal output from the first selection means.

* * * * *